(12) United States Patent
Kegler et al.

(10) Patent No.: US 10,670,474 B2
(45) Date of Patent: Jun. 2, 2020

(54) TEMPERATURE SENSOR

(71) Applicant: Infineon Technologies AG, Neubiberg (DE)

(72) Inventors: Christian Kegler, Munich (DE); Johannes Georg Laven, Taufkirchen (DE); Hans-Joachim Schulze, Taufkirchen (DE); Guenther Ruhl, Regensburg (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/369,057

(22) Filed: Dec. 5, 2016

(65) Prior Publication Data

US 2017/0082502 A1    Mar. 23, 2017

Related U.S. Application Data

(63) Continuation of application No. 14/579,154, filed on Dec. 22, 2014, now Pat. No. 9,515,243.

(51) Int. Cl.
*G01K 7/16* (2006.01)
*H01L 35/04* (2006.01)
*H01L 35/18* (2006.01)
*H01L 35/14* (2006.01)
*H01L 29/16* (2006.01)
*H01L 29/20* (2006.01)

(52) U.S. Cl.
CPC .............. *G01K 7/16* (2013.01); *H01L 29/16* (2013.01); *H01L 29/1602* (2013.01); *H01L 29/1604* (2013.01); *H01L 29/1608* (2013.01); *H01L 29/20* (2013.01); *H01L 29/2003* (2013.01); *H01L 35/04* (2013.01); *H01L 35/14* (2013.01); *H01L 35/18* (2013.01)

(58) Field of Classification Search
None
See application file for complete search history.

(56) References Cited

U.S. PATENT DOCUMENTS

| | | |
|---|---|---|
| 3,649,891 A | 3/1972 | Lawless |
| 5,407,274 A | 4/1995 | Woerheide et al. |
| 5,407,276 A | 4/1995 | Jones |
| 6,229,144 B1 | 5/2001 | Ouvrier-Buffet et al. |
| 6,341,056 B1 | 1/2002 | Allman et al. |
| 7,134,785 B2 | 11/2006 | Takashima et al. |
| 8,373,230 B1 * | 2/2013 | Or-Bach ................ B82Y 10/00 257/347 |

(Continued)

OTHER PUBLICATIONS

Oertel, et al. "Capacitive Sensor System for Measurement of Temperature and Humidity." Fresenius Journal of Analytical Chemistry, 349: 391-393, published in 1994.

(Continued)

*Primary Examiner* — Charles D Garber
*Assistant Examiner* — Steven M Christopher
(74) *Attorney, Agent, or Firm* — Eschweiler & Potashnik, LLC

(57) ABSTRACT

Temperature sensor devices and corresponding methods are provided. A temperature sensor may include a first layer being essentially non-conductive in a temperature range and a second layer having a varying resistance in the temperature range.

19 Claims, 12 Drawing Sheets

(56) References Cited

U.S. PATENT DOCUMENTS

| | | |
|---|---|---|
| 8,829,324 B2 | 9/2014 | Grayson et al. |
| 2003/0210507 A1 | 11/2003 | Pihet |
| 2005/0286211 A1 | 12/2005 | Pinnow et al. |
| 2009/0309186 A1 | 12/2009 | Inoue et al. |
| 2011/0068794 A1 | 3/2011 | Coates |
| 2011/0102183 A1 | 5/2011 | Tenchio |
| 2012/0204957 A1* | 8/2012 | Nicholls ........... H01L 21/02389 136/262 |
| 2013/0049159 A1* | 2/2013 | Schmidt ................. H01L 28/22 257/467 |
| 2013/0256699 A1* | 10/2013 | Vielemeyer ........... H01L 29/778 257/77 |
| 2014/0321507 A1 | 10/2014 | Aliane |
| 2015/0219504 A1 | 8/2015 | Gotsch |

OTHER PUBLICATIONS

Evwaraye, et al. "Shallow and Deep Levels in ntype 4HSiC." Journal of Applied Physics. 79 (10), May 15, 1996.

Corrected Notice of Allowance dated Aug. 24, 2016 for U.S. Appl. No. 14/579,154.

Notice of Allowance dated Aug. 5, 2016 for U.S. Appl. No. 14/579,154.

Non-Final Office Action dated Feb. 19, 2016 for U.S. Appl. No. 14/579,154.

\* cited by examiner

TEMPERATURE SENSOR

REFERENCE TO RELATED APPLICATION

This application is a continuation of U.S. application Ser. No. 14/579,154 filed on Dec. 22, 2014, the contents of which are incorporated by reference in their entirety.

FIELD

The present application relates to temperature sensors and corresponding methods.

BACKGROUND

Temperature sensors are generally used in many applications to measure a temperature. For precise temperature measurements, it is generally desirable that the sensors themselves have a low power dissipation, in particular at the position of the sensor, as power dissipation may cause heating which, in turn, may influence the measurement itself. For some applications it is also desirable that the temperature sensor be robust against magnetic fields.

Conventional temperature sensors may, for example, be based on pn-diodes or be based on measurement resistors made, for example, of platinum. Both types of sensors require a constant current and, therefore, cause a corresponding power dissipation. Furthermore, capacitive temperature sensors are used which have essentially no power dissipation at the sensor itself. Conventional capacitive temperature sensors are based on dielectric materials, the dielectric constant of which has a strong temperature dependence.

DETAILED DESCRIPTION

Figure 1:
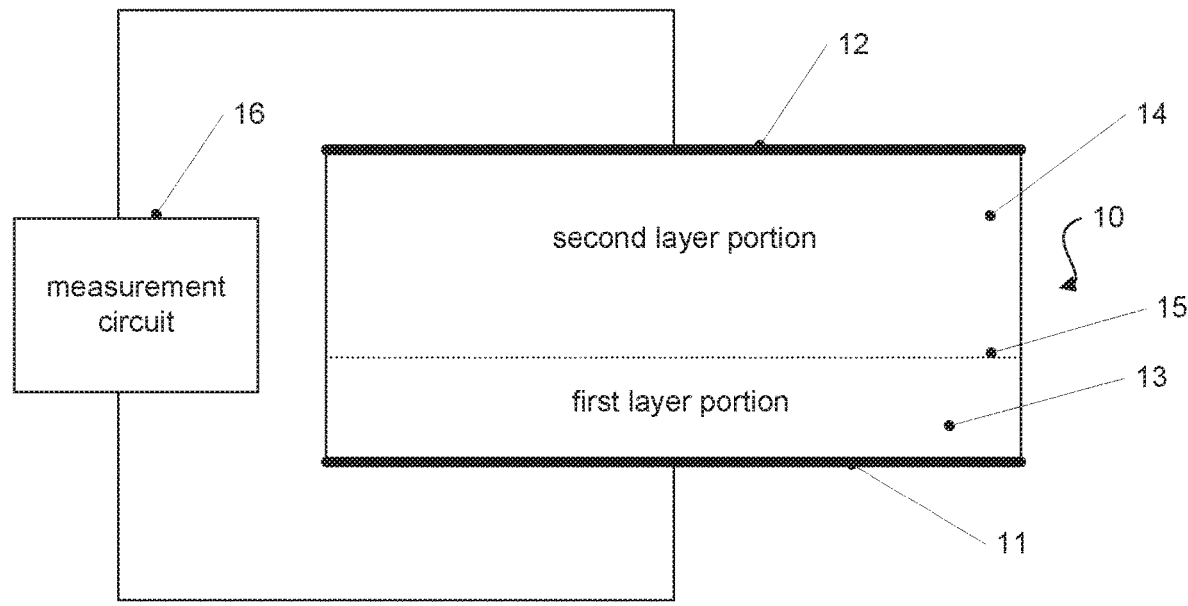
FIG. 1 is a schematic representation of a temperature sensor together with a measurement circuit according to an embodiment.

In the following, various embodiments will be described in detail with reference to the attached drawings. It should be noted that these embodiments are given only for illustration purposes and are not to be construed as limiting the scope of the present application.

Features of different embodiments described in the following or shown in the drawings may be combined with each other unless specifically noted otherwise. Also, a modification or variation described with respect to one of the embodiments may also be applicable to other embodiments unless noted to the contrary.

Furthermore, while embodiments may be described as comprising a plurality of different elements or features, in other embodiments some of these elements or features may be omitted and/or replaced by alternative features or elements. In other embodiments, additionally or alternatively, further features or elements apart from the ones explicitly described and shown may be provided.

Various elements shown in the drawings are not necessarily to scale with each other, and the spatial arrangement of the various elements shown in the drawings is not to be construed as limiting, but is to be taken as an example only. Any numerical values given serve illustration purposes and may vary depending on the particular implementation.

In some embodiments, a temperature sensor comprising layer portions is provided. Layer portions in some cases may be separate distinguishable layers, but in other cases may also be portions having a certain property, which then, for example gradually changes from a first layer portion to a second layer portion. In such cases, there is a gradual transition from one layer portion to the other.

In some embodiments, a temperature sensor may be designed for a temperature range. In the temperature range, in some embodiments the first layer portion may have essentially a dielectric (electrically insulating) behaviour, while the second layer portion may have a temperature-dependent resistance. For example, the resistance of the second layer portion may change by at least one order of magnitude depending on temperature over the temperature range while having a specific resistivity smaller than 10 k$\Omega$cm, e.g. smaller than 5 k$\Omega$cm. In some embodiments, the first layer portion may comprise a dielectric material and/or an undoped or lowly doped semiconductor material and may have a specific resistance greater than 10 k$\Omega$cm, e.g. greater than 20 k$\Omega$cm. The second layer portion may comprise a doped semiconductor material, for example having a dopant concentration higher than the first layer portion at least in parts thereof. In some embodiments, the semiconductor material of the first layer portion and/or second layer portion may comprise a high band gap material, for example a semiconductor material having a band gap of more than 1.5 eV, for example more than 2 eV. In other embodiments, other materials or techniques may be employed, for example semiconductor materials having a band of more than 1.1 eV, e.g. silicon. However, in still other embodiments semiconductor materials having an even lower band gap may be used.

In some embodiments, a temperature sensor device is provided, comprising: a first electrode, a semiconductor layer, and
a second electrode, the semiconductor layer comprising a first layer portion with a dopant concentration below $1 \times 10^{11}$ cm$^{-3}$ and a second layer portion with a peak dopant concentration of at least $5 \times 10^{12}$ cm$^{-3}$ or at least $1 \times 10^{13}$ cm$^{-3}$.

A dopant concentration in the second layer portion may increase from the first layer portion towards the second electrode.

In some embodiments, the semiconductor layer further comprises a third layer portion adjacent to the second electrode, a dopant concentration in the third layer portion being at least $1 \times 10^{17}$ cm$^{-3}$.

The semiconductor layer, in some embodiments, may comprise a wide band gap semiconductor.

In some embodiments, a method may be provided, comprising:
providing a first electrode,
providing a first layer portion, the first layer portion being essentially non-conductive in a temperature range,
providing a second layer portion, the second layer portion having a temperature-dependent resistance in the temperature range, and
providing a second electrode.

In some embodiments, providing the first layer portion and/or providing the second layer portion may comprise depositing a semiconductor material, but is not limited thereto.

In some embodiments, a method of operating a device may be provided, the device comprising:
a semiconductor device comprising a field effect transistor, and
a temperature sensor device, the temperature sensor device comprising a first layer portion, the first layer portion being essentially electrically non-conductive in a temperature range, and a second layer portion, the second layer portion having a temperature-dependent electrical resistance in the temperature range,
wherein the semiconductor device and the temperature sensor device share at least one of a source terminal or a drain terminal of the field effect transistor,
the method comprising:
applying a gate control signal between the gate terminal and the source terminal, and applying a further signal between gate terminal and source terminal.

The further signal may have a higher frequency than the gate control signal.

The frequency of the further signal in some embodiments may be at least one order of magnitude higher than the frequency of the gate control signal.

An amplitude of the further signal may be lower than an amplitude of the gate control signal, but is not restricted thereto.

The method may further comprise determining a temperature based on a response of the temperature sensor device to the further signal.

The method may further comprise modifying the gate control signal based on the determined temperature, for example to implement a temperature protection or temperature compensation.

Generating the further signal may comprise generating the further signal only during parts of the gate control signal. In other embodiments, the further signal may be generated continuously.

Turning now to the figures, in FIG. 1 a schematic cross-sectional view of a temperature sensor 10 according to an embodiment coupled with a measurement circuit 16 is illustrated. The temperature sensor 10 may comprise a first electrode 11 and a second electrode 12. Between first electrode 11 and second electrode 12, a first layer portion 13 and a second layer portion 14 may be provided. A border or interface area 15 between first layer portion 13 need not be an abrupt interface, but the transition may also be a gradual transition. First electrode 11 and second electrode 12 may each be metal electrodes, but may each also comprise any other electrically conducting material, e.g. doped semiconductor material.

First layer portion may have a dielectric behaviour in a temperature range of interest, i.e. a temperature range for which temperature sensor 10 is intended. Essentially dielectric behaviour in this respect may mean that the first layer portion 13 acts as an insulator, for example with a resistance exceeding 10 kΩcm.

For example, first layer portion 13 may comprise a semiconductor material, for example a wide gap semiconductor material, with a dopant concentration below $10^{12}$ cm$^{-3}$, for example below $10^{11}$ cm$^{-3}$, although not limited thereto. For example, the semiconductor material may be nominally undoped, with only background impurities being present, or may have a low dopant concentration, for example one order of magnitude above a background impurity concentration, to provide a well-defined behaviour.

In other embodiments, other kinds of dielectric materials, for example an oxide material like silicon dioxide or a nitride material like silicon nitride may be used. In other embodiments, other materials may be used.

Second layer portion 14 may comprise a material which significantly changes its resistance in a temperature range of interest. In some embodiments, the resistance of second layer portion 14 may change by one order of magnitude or more over the temperature range of interest. For example, second layer portion 14 may comprise a doped semiconductor material. A dopant concentration may vary or be constant within second layer portion 14. In some embodiments, the dopant concentration may increase towards electrode 12 to provide a good electrical contact to second electrode 12. A semiconductor material, a dopant material and a dopant concentration may be selected depending on a temperature range of interest. In some embodiments, dopants having deep dopant levels, for example deep donor levels or acceptor levels, may be used. For example, an energy difference between dopant level and conduction band (or valence band) may be 0.2 eV, 0.3 eV or even more. It should be noted that in some embodiments more than one dopant may be used. For example, in some embodiments a wide band gap semiconductor may be used. In some embodiments, the same semiconductor material as for the first layer portion 13 but with higher dopant concentration at least in parts of second layer portion 14, may be used. Examples for suitable semiconductors and dopants will be given later in more detail.

Figure 2:
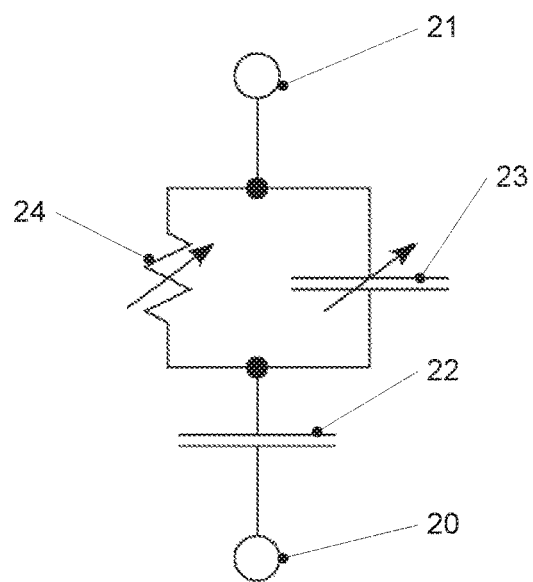
FIG. 2 illustrates a schematic equivalent circuit of a temperature sensor according to an embodiment.

FIG. 2 illustrates a simplified equivalent circuit for the temperature sensor 10 of FIG. 1. It should be noted that the equivalent circuit of FIG. 2 is not necessarily an exact representation of the electrical functions of temperature sensor 10, but may be an approximation sufficient to illustrate basic operating principles.

In FIG. 2, a terminal 20 may correspond to first electrode 11 of FIG. 1, and a terminal 21 may correspond to second electrode 12 of FIG. 1.

First layer portion 13, which has a dielectric behaviour, essentially operates as a capacitor 22. Second layer portion 14, which in the temperature range of interest has a well-defined temperature-dependent resistance, may basically be seen as a temperature-dependent resistor 24 in parallel to a temperature-dependent capacitor 23. Capacitor 22 is coupled in series to the parallel connection of temperature-dependent resistor 24 and temperature-dependent capacitor 23, as illustrated in FIG. 2.

When the temperature varies, temperature-dependent capacitor 23 and temperature-dependent resistor 24 vary their capacitance and resistance value, respectively. This changes the overall capacitance of the equivalent circuit of FIG. 2 and may be detected, for example by applying a variable voltage at terminals 20, 21 and measuring a current flowing in response thereto. Any other conventional capacitance measurement may also be used. In some embodiments, a measurement circuit like measurement circuit 16 of FIG. 1 may be used to implement such a measurement. In embodiments, measurement circuit 16 may be integrated with temperature sensor 10 on a same chip, although this need not be the case.

Therefore, by using essentially a conventional capacitance measurement, a temperature may be determined. In some embodiments, to obtain a relationship between capacitance and temperature, temperature sensor 10 may be calibrated.

Figure 3:
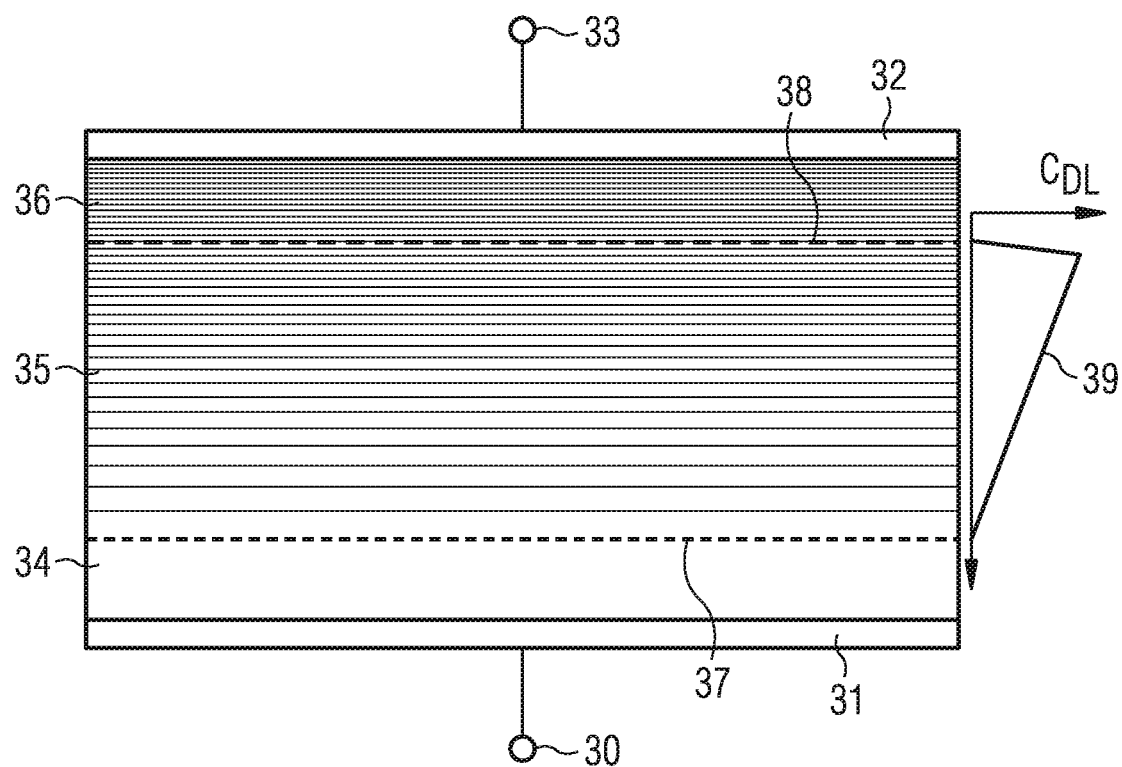
FIG. 3 illustrates a temperature sensor according to an embodiment.

In FIG. 3, a cross sectional view of a temperature sensor according to an embodiment is illustrated. The embodiment of FIG. 3 may be seen as a non-limiting example implementation of temperature sensor 10 of FIG. 1. The temperature sensor of FIG. 3 comprises a first terminal 30 coupled to a first electrode 31 and a second terminal 33 coupled to a second electrode 32. First and second terminals 30, 33 may then, for example, be coupled to a measurement circuit like measurement circuit 16 to measure a temperature, for example by measuring a capacitance of the temperature sensor illustrated in FIG. 3. First and second electrodes 31, 32 each may be made of metal or any other conductive material, for example doped crystalline or polycrystalline semiconductor material.

The embodiment of FIG. 3, adjacent to first electrode 31, a dielectric layer 34 is provided. In some embodiments, dielectric layer 34 may comprise a semiconductor, for example a wide band gap semiconductor, with a low dopant concentration, for example smaller than $10^{12}$ cm$^{-3}$ or smaller than $10^{11}$ cm$^{-3}$, or a nominally undoped semiconductor. In a temperature range to be measured by the temperature sensor of FIG. 3, first layer portion 34 may be essentially electrically non-conducting, i.e. have a dielectric behaviour. In other embodiments, other dielectric materials may be used.

On top of first layer portion 34, a second layer portion 35 is provided. In the embodiment of FIG. 3, second layer portion 35 comprises a semiconductor material with a gradually increasing dopant concentration $C_{DL}$. The gradual increase, for example, starts at a plane indicated by 37 in FIG. 3. An example for a gradually increasing dopant concentration is indicated by a curve 39 in FIG. 3. A peak dopant concentration in second layer portion 35 may be at least $5\times10^{12}$ cm$^{-3}$, for example at least $1\times10^{13}$ cm$^{-3}$, but is not limited thereto.

A suitable dopant may have a comparatively deep dopant level. Suitable dopants and semiconductor materials will be discussed later. In some embodiments, a semiconductor material used as a basis for layer portion 35 may be a semiconductor material used for first layer portion 34, too. Second layer portion 35 may exhibit a temperature-dependent electrical resistance in a temperature region of interest. Through the gradually varying dopant concentration as shown by curve 39, the resistance and its temperature-dependent variation in addition varies spatially in the direction of the variation (vertical direction in the representation of FIG. 3). This direction is also referred to as depth direction.

On top of second layer portion 35, a highly doped contact layer portion 36 is provided. For example, degenerate doping using a dopant with a shallow dopant level may be used to provide good electrical contact (for example ohmic electrical contact) to second electrode 32. A dopant concentration in contact layer portion 36 may e.g. be $1\cdot10^{17}$ cm$^{-3}$ or more. The dopant used in contact layer portion 36 may differ from the dopant used in second layer portion 35, for example may have a shallower dopant level. In such a case where different dopants are used in portions 35 and 36, as indicated by curve 39, the concentration of the dopant used in second layer portion may essentially drop to nominally zero at an interface between portions 35 and 36. "Nominally" here indicates that some non-zero concentration may remain e.g. due to background impurities, but substantially no intentional doping with this dopant is performed.

As an approximation, for the temperature sensor of FIG. 3 the equivalent circuit of FIG. 2 may be used also, and the functioning of the temperature sensor of FIG. 3 may essentially correspond to the functioning as explained with reference to FIG. 2.

Figure 4:
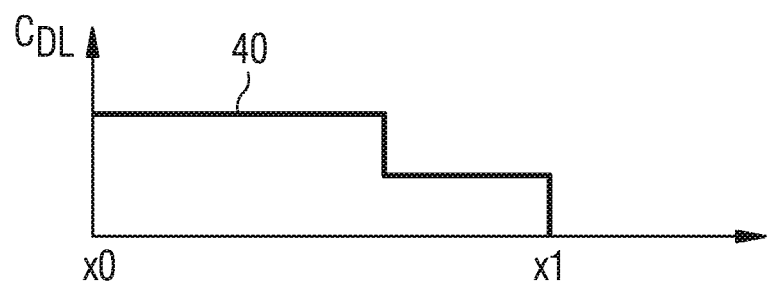
FIG. 4 illustrates a dopant profile of a temperature sensor according to an embodiment.

In the embodiment of FIG. 3, the concentration as indicated by curve 39 increases gradually within second layer portion 35. In other embodiments, other dopant concentration profiles may be used. As an example, FIG. 4 shows an alternative profile 40 with a stepwise increase from x1 (which may, for example, correspond to a position of plane 37) to x0 (which may, for example, correspond to a position of a plane 38). While a single step is illustrated in FIG. 4, in other embodiments more than one step may be used. In other embodiments, for example a constant dopant profile may be used. Other dopant profiles are also possible.

Figure 5:
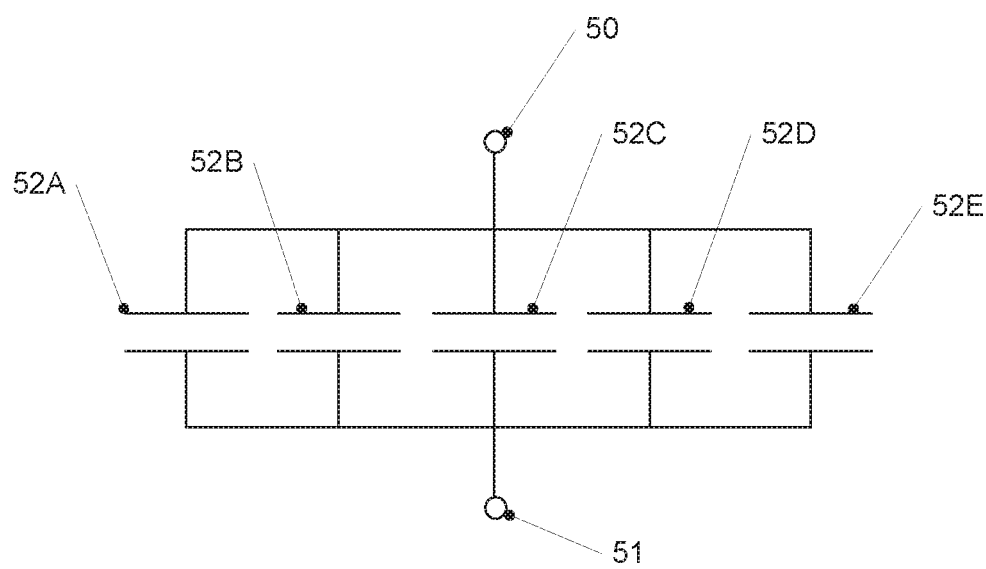
FIG. 5 is a circuit diagram used for illustrating a functioning of temperature sensors according to some embodiments.

In some implementations, embodiments may be designed to cover a comparatively large area, for example up to some mm$^2$, although smaller or larger areas are also possible. In some embodiments, even if, for example, only a comparatively small portion of the area covered by such a temperature sensor is heated, this may be detected by the temperature sensor. To illustrate this, reference will be made to FIG. 5.

An implementation of a temperature sensor as for example illustrated in FIG. 1 or FIG. 3, may be seen as a plurality of capacitors 52A to 52E coupled in parallel between terminals 50, 51. The number of five capacitors 52A to 52E serves merely illustration purposes, and in fact, an embodiment as shown in FIG. 1 or FIG. 3 may be represented essentially as any number of capacitances, each capacitance covering a corresponding fraction of a total area covered by the temperature sensor. Each of capacitances 52A to 52E, in turn, may for illustration purposes be seen as represented by an equivalent circuit as illustrated in FIG. 2.

When now, for example, the temperature increases at a portion of an area covered by the temperature sensor, for example the capacitance of the respective capacitor 52A to 52E corresponding to this portion, increases. Because of the parallel connection, this leads to a corresponding increase of the overall capacitance, which may be sensed at terminals 50, 51. Therefore, for example, a larger area may be monitored to detect heating or other temperature increases.

Figure 6:
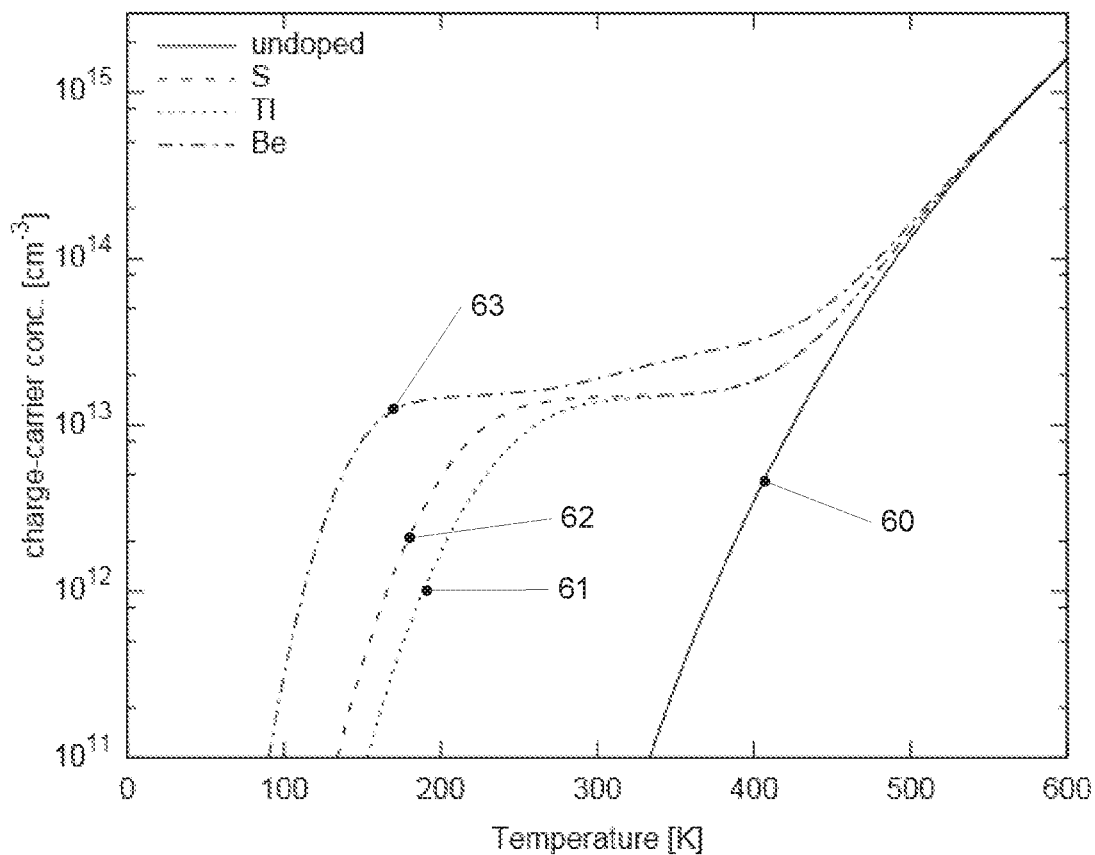
FIGS. 6 to 11 are various diagrams illustrating possible choices of materials for temperature sensors according to some embodiments.

Next, with reference to FIGS. 6 to 11, various possibilities for materials and dopants usable in embodiments will be discussed. In FIG. 6, the charge carrier concentrations versus temperature are illustrated for undoped silicon and silicon doped with different dopants. A band gap of silicon is about 1.12 eV.

A curve 60 illustrates the charge carrier concentration for undoped silicon (intrinsic charge carriers generated by excitation of carriers across the band gap). A curve 61 illustrates the charge carrier concentration ($cm^{-3}$) for thallium (Tl)-doped silicon. A curve 62 illustrates the charge carrier concentration over temperature for sulphur (S) as a dopant, and a curve 63 illustrates the charge carrier concentration over temperature for beryllium (Be) as a dopant. Doping concentration for curve 61 to 63 are $3 \times 10^{13}$ $cm^{-3}$ in each case. For thallium, an energy distance between the donor level and the conduction band is about 0.3 eV, and a usable temperature range (i.e. a temperature range where the resistivity varies), also referred to as the temperature range of interest, is about 150 to 260 K. For sulphur, one of two energy levels is 0.26 eV below the conduction band, and a usable temperature range is about 150-260 K. For beryllium (Be), the relevant energies are 0.17 eV and 0.42 eV, and the temperature range in which the charge carrier concentration varies significantly with temperature is about 170-260 K. Above the above-captioned ranges, a plateau may be seen in FIG. 6, before the curves 61-63 correspond to curve 60 at higher temperatures. Therefore, for example nominally undoped silicon or lowly doped silicon for a temperature sensor for a temperature range of below about 260 K may be used as dielectric material (for example layer portion 13 of FIG. 1 or first layer portion 34 of FIG. 3). Doped silicon (for example doped with thallium, sulphur or beryllium depending on a desired temperature range) may be used as doped semiconductor material, for example to form second layer portion 14 of FIG. 1 or second layer portion 35 of FIG. 3.

Figure 7:
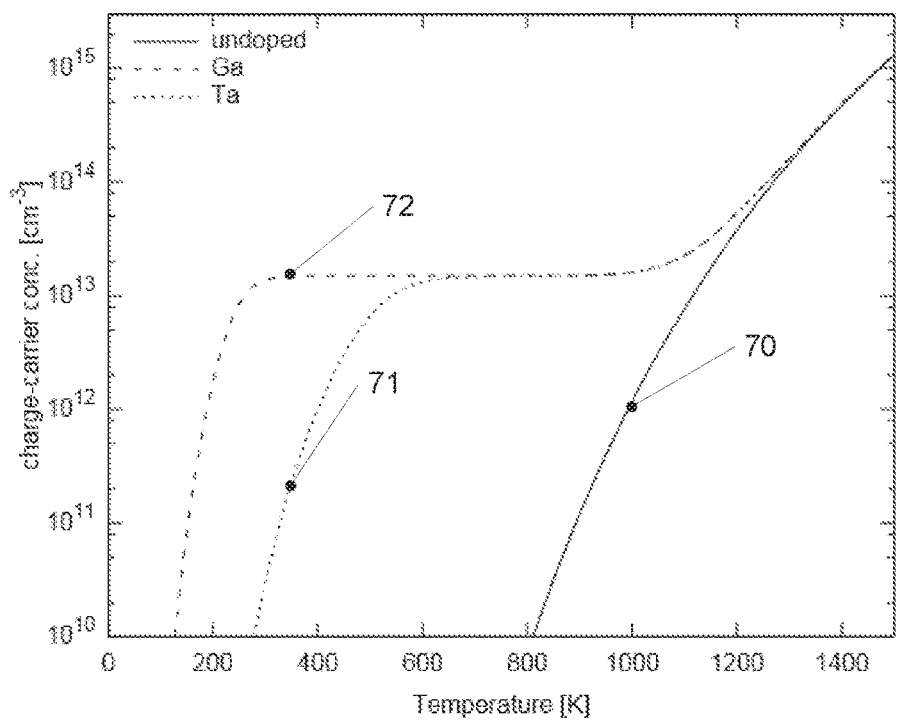

Next, with reference to FIGS. 7 and 8, examples using silicon carbide, in particular, crystalline 4H-SiC, will be discussed. A band gap of such silicon carbide is about 3.26 eV. FIG. 7 illustrates charge carrier concentrations versus temperature similar to the example of FIG. 6. A curve 70 shows the behaviour for undoped silicon carbide, a curve 71 shows the behaviour for silicon carbide doped with tantalum (Ta), and a curve 72 shows the behaviour of silicon carbide doped with gallium (Ga). Dopant concentration in the case of curves 71 and 72 are again $3 \times 10^{13}$ $cm^{-3}$. As can be seen here, tantalum doped silicon carbide (curve 71) shows a significant temperature dependence of charge carrier concentration for a temperature range from about 330 K to about 540 K, and for gallium doping a significant temperature dependence is present between about 150 K and 230 K. In these ranges, undoped silicon carbide (curve 70) is essentially non-conducting and may serve, for example, as dielectric material, for example in first layer portion 13 of FIG. 1 or first layer portion 35 of FIG. 3. Doped silicon carbide may then serve as second layer portion 14 or second layer portion 35 in FIGS. 1 and 3, respectively.

Figure 8:
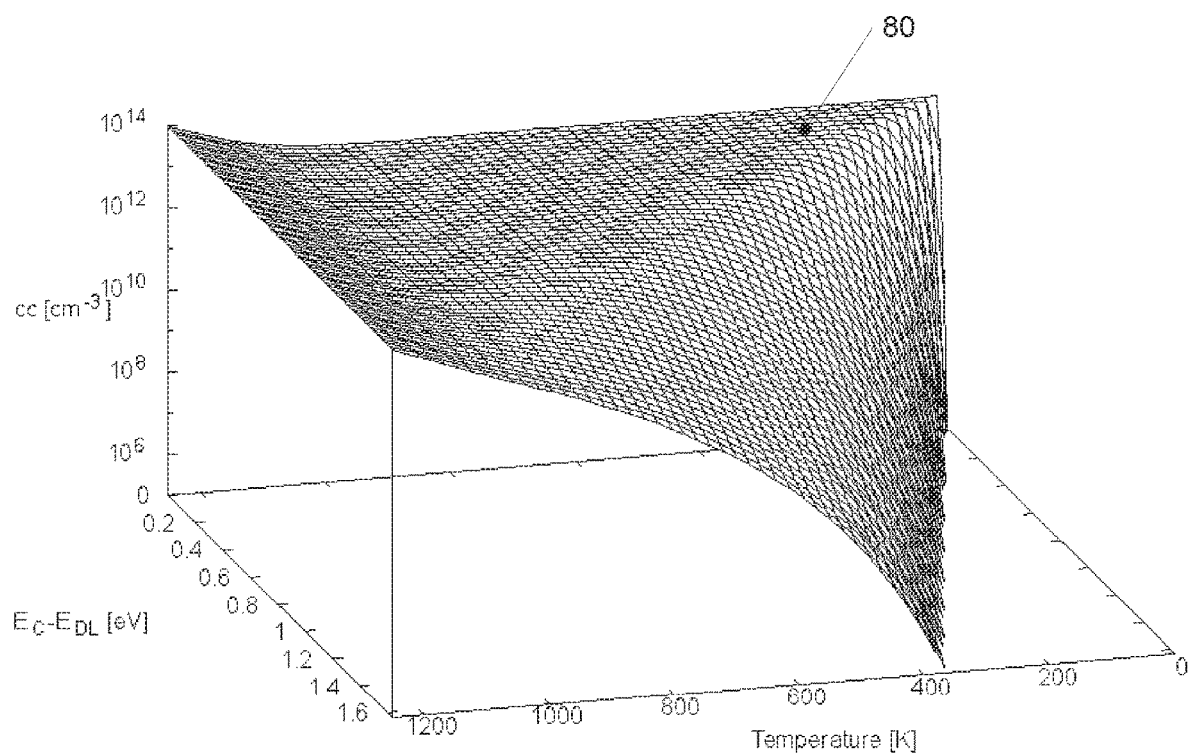

In FIG. 8, a curve 80 illustrates the charge carrier concentration (cc) in $cm^{-3}$ versus temperature and versus donor level. In FIG. 8, the donor level is given as a difference $E_C$-$E_{DL}$ between the energy of the conduction band of the semiconductor ($E_C$) and the energy of the donor level ($E_{DL}$). The donor level depends on the material used as a dopant. For example, for gallium (Ga; curve 72 of FIG. 7) $E_C$-$E_{DL}$ is about 0.3 eV, and for tantalum (Ta, curve 78 in FIG. 7) $E_C$-$E_{DL}$ is about 0.68 eV.

Therefore, curves 71 and 72 of FIG. 7 are essentially cross sections of curve 80 for the respective values $E_C$-$E_{DL}$. As can be seen from FIG. 8, by selecting a suitable dopant, a temperature range for the temperature sensor may be selected. It should be noted that in some embodiments, also combinations of two or more different dopants may be employed to tune the temperature dependency more precisely.

Figure 9:
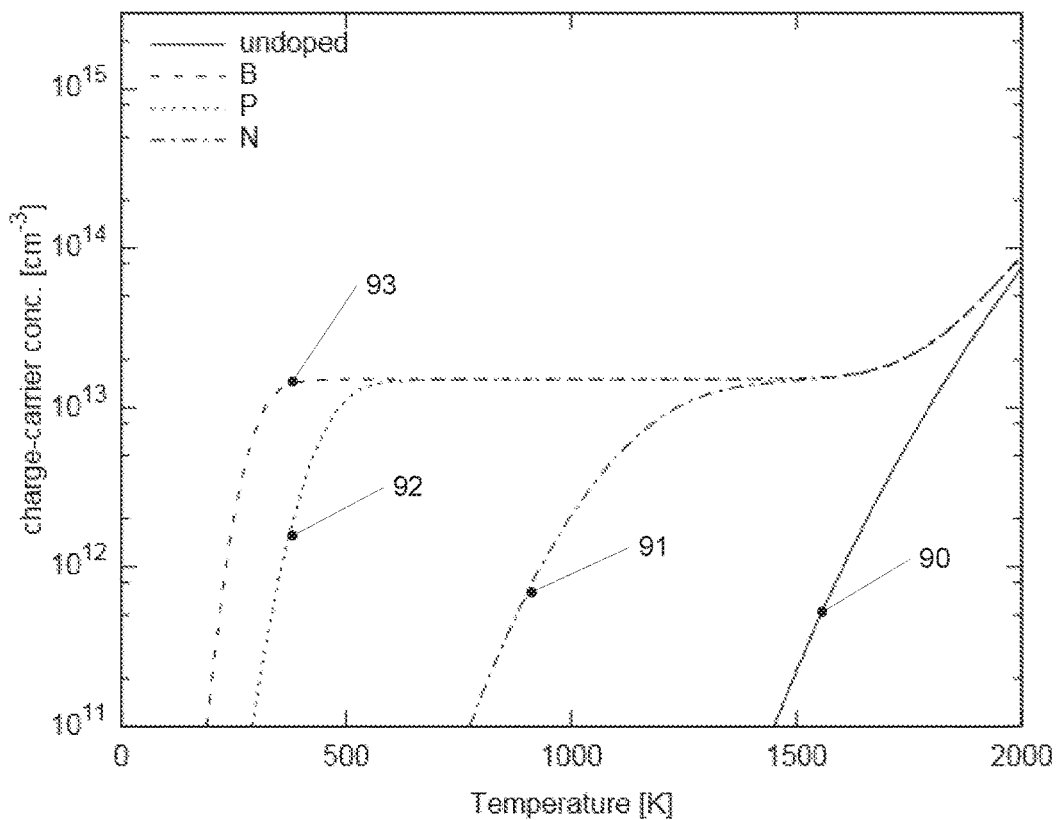

A further example material is diamond, which will be explained referring to FIGS. 9 and 10. A band gap of diamond is about 5.5 eV. FIG. 9 shows a representation of charge carrier concentration versus temperature similar to the representations of FIGS. 6 and 7. A curve 90 illustrates the behaviour for undoped diamond. As can be seen, for temperatures below about 1400 K, the charge carrier concentration is low, for example below $10^{11}$ $cm^{-3}$. A curve 91 illustrates the behaviour for nitrogen (N) as a dopant. Nitrogen in diamond introduces a donor level about 1.7 eV below the conduction band and may be used to design a temperature sensor for a temperature range, for example from 775 K to 1,250 K. A curve 92 shows the behaviour for phosphorus as a donor. Phosphorus introduces a donor level about 0.6 eV below the conduction band and may be suitable for designing a temperature sensor for a range of approximately 300-500 K. A curve 93 shows the behaviour for boron (B) as a donor, introducing an acceptor level about 0.377 eV above the valence band. Such a temperature sensor may, for example, be suitable for a temperature range from about 200 to about 300 K. Dopant concentrations for curves 91 to 93 of FIG. 9 are again $3 \times 10^{13}$. In other embodiments, other dopant concentrations may be used.

Figure 10:
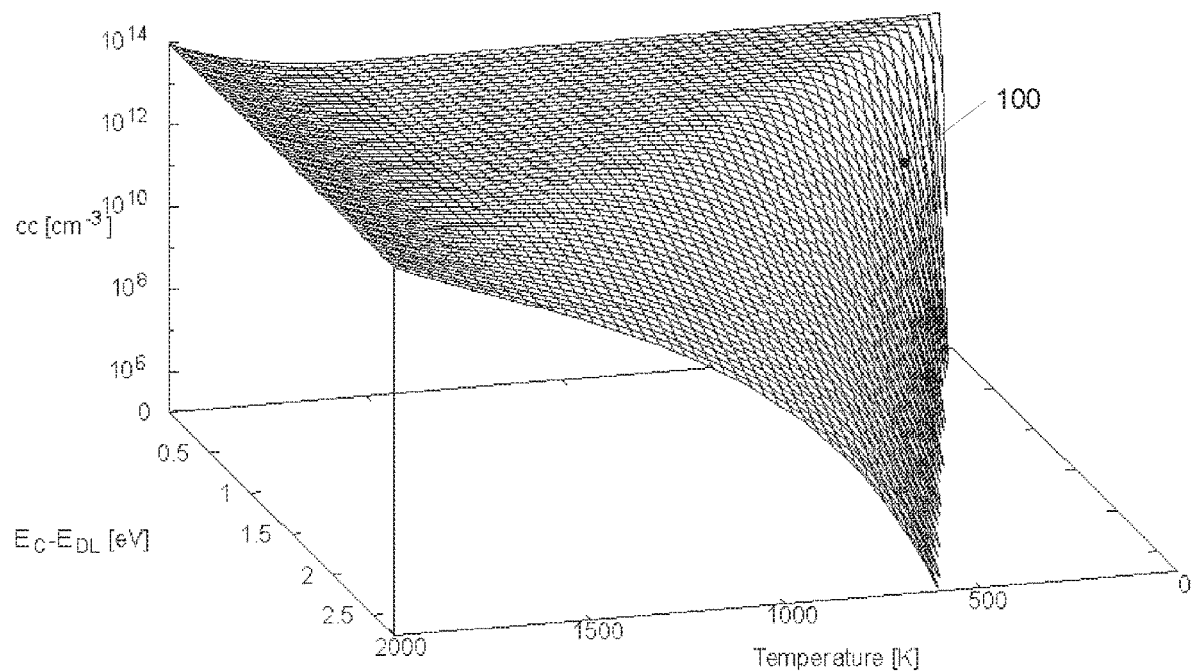

FIG. 10 illustrates a diagram similar to the diagram of FIG. 8, in case of FIG. 10 for diamond. A curve 100 illustrates the carrier concentration (CC) versus temperature and dopant level below the conduction band ($E_C$-$E_{DL}$). Curves 91 to 93 of FIG. 9 essentially constitute cross-sections of curve 100 at the corresponding dopant levels of nitrogen, phosphorus and boron, respectively. As boron is an acceptor in this case the energy corresponds to an energy level above the valence band.

As can be seen, depending on a dopant used, a temperature sensor may be designed for a desired or required temperature range in some embodiments. In some cases, two or more different dopants may be combined with different concentration profiles or substantially the same concentration profile to obtain a desired behaviour, such as a desired temperature dependence.

Therefore, by selecting material, dopant and/or dopant concentration, a temperature sensor suitable for a desired temperature range may be implemented.

Figure 11:
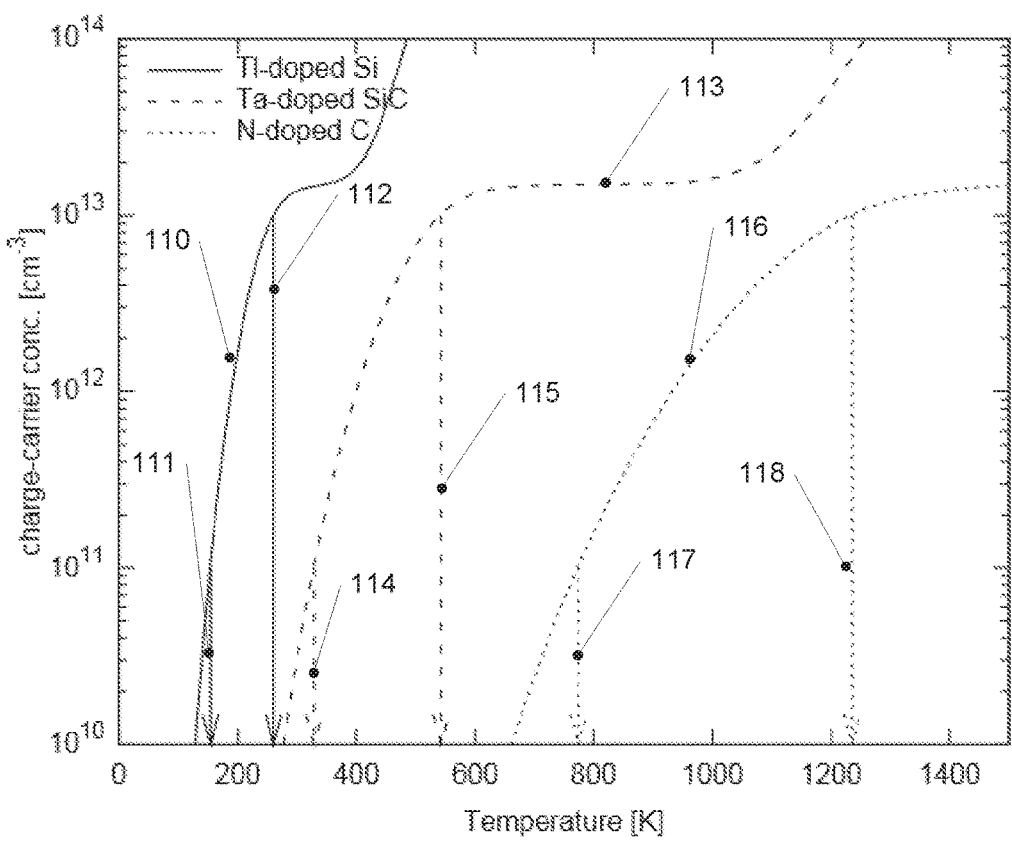

This will be further illustrated referring to FIG. 11. FIG. 11 again illustrates charge carrier concentration versus temperature. A curve 110 illustrates the behaviour for thallium doped silicon and corresponds to curve 61 of FIG. 6. As indicated by arrows 111 and 112, thallium doped silicon may be used for a temperature sensor, for example in a temperature range between about 150 K and 260 K.

A curve 113 illustrates the behaviour for tantalum doped crystalline silicon carbide and corresponds to curve 71 of FIG. 7. As indicated by arrows 114 and 115, tantalum doped silicon carbide may be used in a temperature range between about 330 K and 540 K. A curve 116 illustrates the behaviour for nitrogen doped diamond and may, for example, correspond to curve 91 of FIG. 9. As indicated by arrows 117 and 118, this material may be used, for example, in a temperature range between 775 K and 1250 K. In the example shown, the lower limit of the suitable temperature range has been chosen to be the point where a charge carrier concentration of $10^{11}$ $cm^{-3}$ is reached. In other embodiments, other criteria may be applied.

It is to be noted that the materials, in particular semiconductor materials, and dopants discussed with reference to FIGS. 6 to 11 serve merely as examples, and other materials may be used as well. For example, other suitable materials may include boron nitride (BN) in various modifications (for example amorphous boron nitride (a-BN), hexagonal boron nitride (h-BN), cubic boron nitride (c-BN) or wurtzite boron nitride (w-BN)), amorphous hydrogenated carbon (a-C:H), amorphous silicon (a-Si), other modifications of silicon carbide, gallium nitride (GaN), aluminium nitride (AlN) or gallium arsenide (GaAs). Generally, semiconductor materials used may be amorphous, polycrystalline or single crystals. While in some embodiments for the first (dielectric) layer portion, a same semiconductor material may be used as for the respective second layer portion that changes its resistivity depending on the temperature, in other embodiments, different semiconductor materials may be used, or other materials than semiconductor materials may be employed, for example for the first layer portions (dielectric portions). Other techniques may also be employed, for example using additional layer portions.

Figure 12:
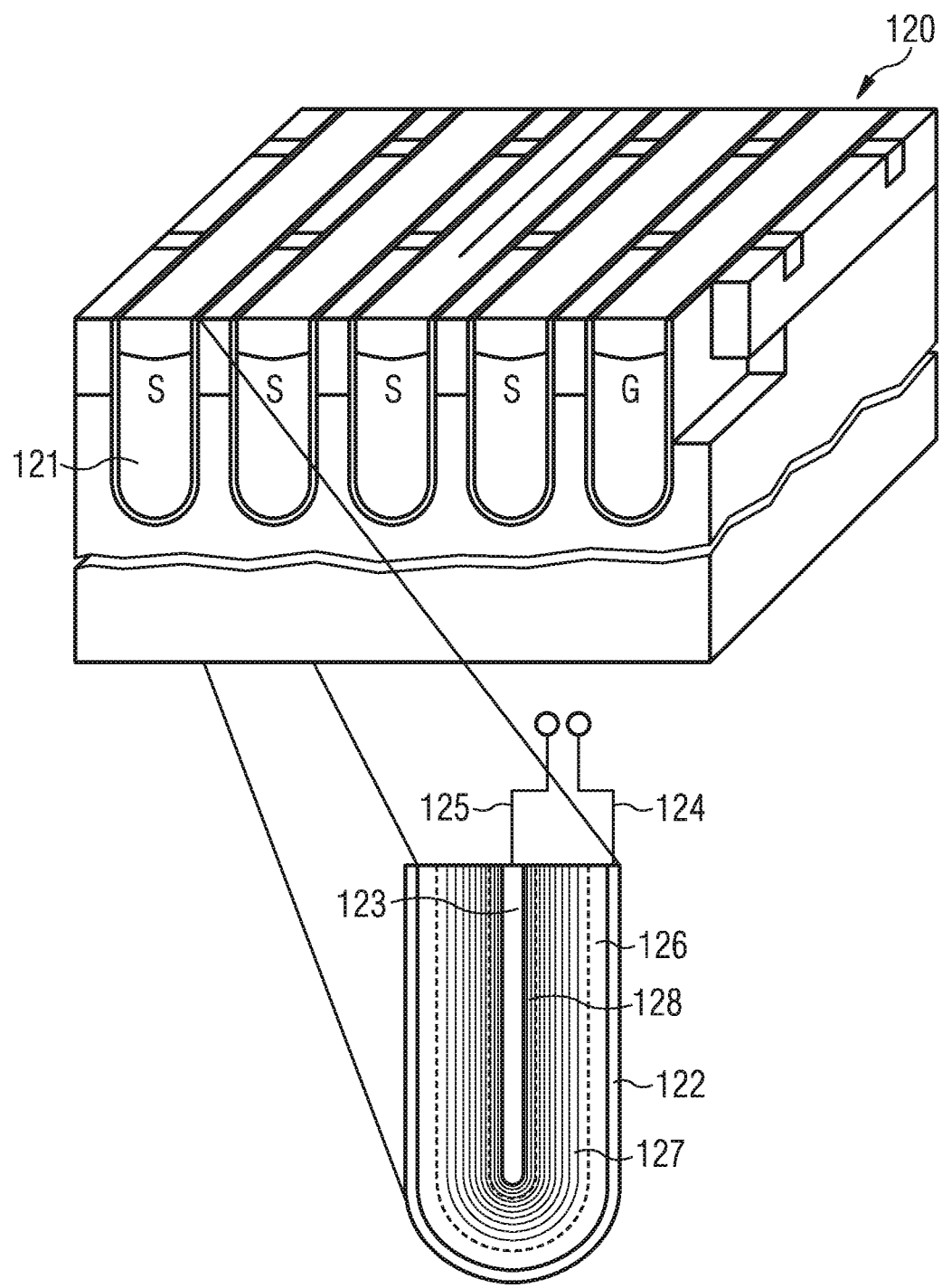
FIG. 12 is a schematic representation of a transistor device comprising a temperature sensor according to an embodiment.

In some embodiments, temperature sensors as previously discussed may be employed as dedicated stand-alone devices for temperature sensing. In other embodiments, temperature sensors as discussed above may be integrated together with other devices, for example to detect a temperature of the other devices. In some cases, this may be used in safety applications to detect overheating of such other devices. An example for the integration of a temperature sensor with other devices will now be discussed with reference to FIG. 12. In the example of FIG. 12, a power transistor device 120, for example an insulated gate bipolar transistor (IGBT) or a junction field effect transistor (JFET) may be used. In the example implementation shown in FIG. 12, a plurality of trenches 121 is formed for implementing the device. According to some embodiments, a temperature sensor as discussed above may be formed in one or more of the trenches, as illustrated. The temperature sensor of FIG. 12 comprises a first electrode 121 formed in one or more of the trenches. On first electrode 121, a first layer portion 126 having a dielectric behaviour in a desired temperature range followed by a second layer portion 127, which in the temperature range of interest exhibits a temperature-dependent resistance, is provided. First and second layer portions 126, 127 may be implemented as discussed previously, for example with reference to FIGS. 1, 3 and 4, and modifications and materials discussed above may also be applied to the temperature sensor of FIG. 12. Second layer portion 127 in the example of FIG. 12 is followed by a contact portion 128, for example of a highly doped semiconductor material, to contact a second electrode 123. First electrode 122 (which may correspond to a substrate or other semiconductor region) and second electrode 123 may then be contacted by electrical contacts 124, 125 to perform temperature measurements as discussed above. As can be seen from FIG. 12, the layers of a temperature sensor need not have a plane form or configuration as illustrated in FIGS. 1 and 3, but may also be provided in a bent shape, for example to accommodate the form of a trench as illustrated in FIG. 12. Other shapes and forms may also be possible, as long as the basic electric function of the various layer portions is essentially preserved. The implementation of a temperature sensor in trenches of a power transistor device in FIG. 12 serves only as an example, and temperature sensors according to embodiments may also be used together with other kinds of devices.

In the example of FIG. 12, for example layer portion 126 to 128 may be made of diamond, which may, for example, be deposited by chemical vapour disposition (CVD). As diamond has a good thermal conductivity, a fast detection of an overheating of device 120 may be possible in some embodiments. In other embodiments, other materials may be used.

As already mentioned, in addition, a measuring circuit like the one of FIG. 1 may also be integrated on the same device in some embodiments. The measurement circuit may also be adapted to respond to the temperature measured. For example, in case an overheating is detected, counter measures may be taken, for example increasing ventilation or other cooling, warning of a user, or even shutdown of the device, depending on the circumstances and application.

Figure 13:
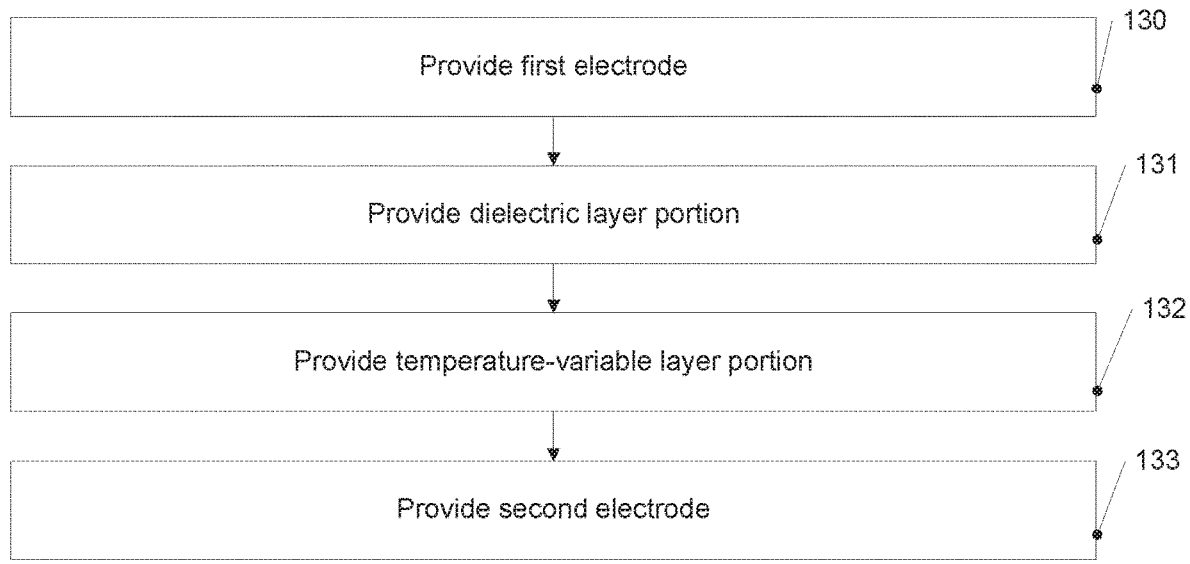
FIG. 13 is a flow chart illustrating a method for manufacturing a temperature sensor according to an embodiment.

FIG. 13 is a flow chart illustrating a method for manufacturing a temperature sensor according to an embodiment. The method of FIG. 13 may, for example, be used to manufacture temperature sensors as discussed with reference to FIGS. 1 to 12, and variations and modifications discussed with reference to FIGS. 1 to 12 may also be applicable to the method of FIG. 13. However, the method of FIG. 13 may also be used to manufacture other temperature sensors.

While the method of FIG. 13 is illustrated as a series of acts or events, the order in which the acts or events are described and presented is not to be construed as limiting. For example, in other embodiments, the order of the acts or events may be reversed. For example, the order of acts or events described with reference to 131 and 132 may be exchanged.

At 130, the method of FIG. 13 comprises providing a first electrode. The first electrode may, for example, be deposited by any conventional metal deposition techniques. In some embodiments, the first electrode may be deposited in a trench, or the first electrode may be formed by a substrate or other semiconductor material.

At 131, a dielectric layer portion is provided. In some embodiments, the dielectric layer portion may be made of a semiconductor material having a low dopant concentration, for example below $10^{11}$ cm$^{-3}$ or below $10^{10}$ cm$^{-3}$. In some embodiments, the semiconductor material may be wide band gap material, for example having a band gap of more than 1.5 eV or more than 2.0 eV. In other embodiments, semiconductor materials like silicon having a lower band gap may be used. In still other embodiments, dielectric materials other than semiconductor materials may be used. In some embodiments, the dielectric layer portion may be essentially electrically non-conducting in a temperature range for which the temperature sensor is designed.

At 132, a layer portion having a temperature-dependent resistance in the temperature range for which the temperature sensor is designed is provided. The temperature-dependent layer portion may, for example, be made of a doped semiconductor material as discussed above. In some embodiments, the semiconductor material of the layer portion provided at 132 may be the same semiconductor material as used for providing the dielectric layer portion at 131, although this need not be the case. In some embodiments, a peak dopant concentration at 132 may be $10^{13}$ cm$^{-3}$ or more. In some embodiments, the dopant concentration may have a step profile or a ramp profile.

At 133, a second electrode is provided. The second electrode may, for example, be provided by conventional metal deposition or also deposition of other materials having a high conductivity. In some embodiments, prior to providing the second electrode, a highly doped semiconductor layer, for example a degenerately doped semiconductor layer, may be provided to improve electrical contact.

In some embodiments, the providing at 131 and/or 132 may comprise depositing a semiconductor material, for example a wide band gap semiconductor material, by physical vapour deposition (PVD), chemical vapour deposition (CVD) or atomic layer deposition (ALD). Other techniques may also be used. For example, in case diamond is used as a material depositing temperatures between 500° C. and 1,200° C. may be used in a CVD process at a pressure at or below atmospheric pressure. As precursor gas in some embodiments, carbon hydrides, for example methane, may be used in combination with an excess of hydrogen radicals. Hydrogen radicals may be generated by the dissociation of hydrogen molecules in a plasma, for example by microwave excitation, or using a heated tungsten wire. Deposition of diamond may be supported by providing diamond seed crystals or impurities/defects on a substrates provided, for example on the first electrode. However, depending on the material used, any conventional deposition techniques may be employed.

In the embodiments above, temperature sensors have been discussed as stand alone devices or as integrated within another device. In the embodiments discussed above, the temperature sensor has dedicated terminals (for example terminals 30, 33 of FIG. 3 or terminals 125, 124 of FIG. 12) to read out the temperature sensor. In other embodiments which will be discussed next, the temperature sensor may be integrated with a device such that the device or part thereof serves as an electrode and/or the temperature sensor may share one or more terminals with the device. Examples for such embodiments will be discussed next with reference to FIGS. 14 through 21. Apart from differences explicitly mentioned below, temperature sensors used in the embodiments of FIGS. 14 to 21 may be designed and configured as discussed with reference to FIGS. 1 to 13, and variations or modifications discussed with reference to FIGS. 1 to 13 may also be applicable to the embodiments of FIGS. 14 to 21.

While an insulated gate bipolar transistor will be used as an example below for an integration of a temperature sensor with a device, this is not to be construed as limiting, and a temperature sensor may also be integrated with other devices, for example other kinds of field effect transistors.

Figure 14:
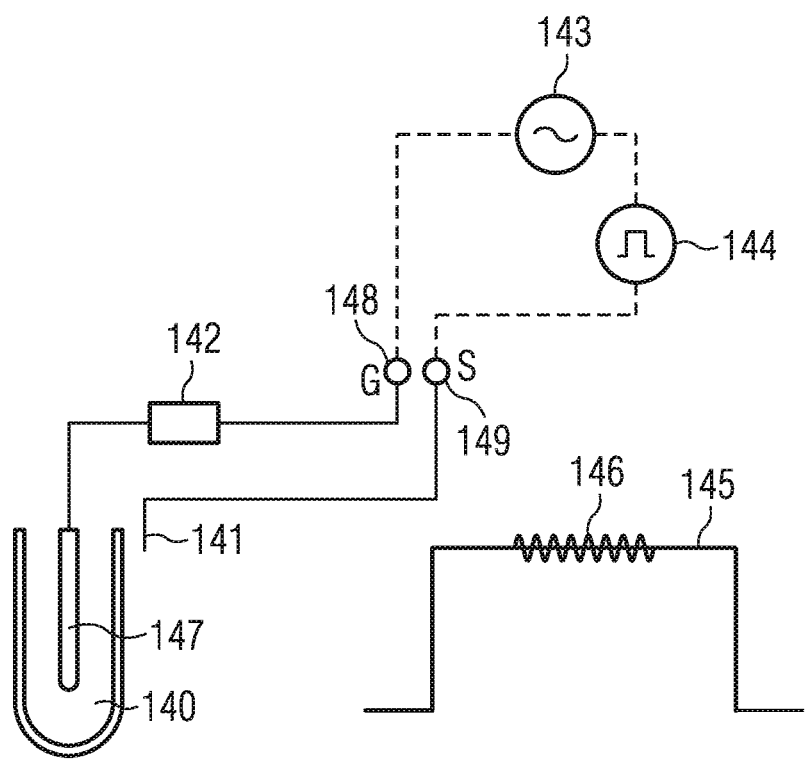
FIG. 14 is a diagram illustrating a sensor integrated with a device and its control according to a further embodiment.

In the embodiment of FIG. 14, a temperature sensor 140 as illustrated already in FIG. 12 is provided in a trench of a semiconductor device, for example the trench of an insulated gate bipolar transistor (IGBT) or other field effect transistors (FET). In case of the embodiment of FIG. 14, a first electrode of the temperature sensor is not explicitly favoured and contacted, and a part of the device, comprising e.g. a source terminal, serves as first electrode, and the second electrode of the temperature sensor at the same time may serve as gate electrode of the insulated gate bipolar transistor. For example, in FIG. 14, 141 denotes a source region serving as an electrode serving as a first electrode of temperature sensor 140. Electrode 147 denotes an electrode corresponding for example to a second electrode of temperature sensor 140.

Electrode 147 is coupled to a gate terminal 148 via an optional resistor 142. Source region 141 is coupled with a source terminal 149. Resistor 142 in some embodiments may comprise a temperature-dependent resistor having a negative temperature coefficient (NTC). Generally speaking, in embodiments the temperature dependence of resistor 142 may have the opposite sign compared to the temperature-dependent resistance of the second layer portion of temperature sensor 140, such that when one of the resistances increases with temperature, the other decreases and vice versa. In some embodiments, resistor 142 serves to compensate changes of the resistance of a second layer portion of temperature sensor 140, e.g. to mitigate an influence on the behaviour of the IGBT shown in response to a gate-source voltage applied between terminals 148, 149.

Resistor 142, in particular, may be configured to minimize variations of the overall RC product of resistor 142 and temperature sensor 140, i.e. to keep $R(T) \times C(T)$ approximately constant in a temperature range of interest. $R(T)$ denotes the temperature (T)-dependent resistance and $C(T)$ denotes the temperature-dependent capacitance of the combination of resistor 142 and temperature sensor 140. For example, a change of $R(T) \times C(T)$ may be kept below 50%, below 20% or below 10% in a temperature range of interest (for example between 0 and 150° Celsius in some embodiments employing an IGBT).

For example, in some embodiments resistor 142 may be formed as an resistor array, which where individual resistors are activated depending on the temperature measured by temperature sensor 140, for example by signal generating circuit 144 to reduce changes in the overall RC constant.

Next, gate control for the IGBT is shown and operation of temperature sensor 140 will be discussed.

For example, in the embodiment of FIG. 14, a first signal generating circuit 144 serves for generating a gate-source voltage, for example for turning the IGBT on and off. Such a control signal may be essentially a rectangular signal with changing pulse width, as indicated by a curve 145 in FIG. 14. The pulse width may depend on a derived gate control. A frequency of this rectangular signal, corresponding for example to a switching frequency of the IGBT, may be in the Kilohertz range, for example between 0.1 kHz and 100 kHz.

Furthermore, a second signal generating circuit 143 serves to apply a sense signal between gate terminal 148 and source terminal 149 used for reading temperature sensor 140 (e.g. by applying a voltage signal as the sense signal and measuring a current response to the voltage or vice versa). An example for such a signal is denoted 146 in FIG. 14. Signal 146 in some embodiments may have a sine shape. An amplitude of the sense signal generated by second signal generating circuit 143 (for example signal 146) may have an amplitude smaller than and/or a frequency higher than amplitude or frequency of a signal generated by first signal generating circuit 144, respectively. For example, a frequency of a signal generated by second signal generating circuit 143 may be in the Megahertz range in some embodiments. For example, a frequency of signal 146 may be one order magnitude, for example two orders of magnitude higher than a frequency of signal 145. While in the embodiment of FIG. 14 and in other embodiments to be described later two distinct signal generating circuits (e.g. 143, 144 in FIG. 14) are shown and described, in other embodiments the functionality of providing first an second signals (e.g. 145, 146 in FIG. 14) may be implemented in a single circuit. Such a single circuit may for example comprise a multi-frequency generator. The term "signal generating circuitry" may be used herein to generically refer to one or more circuits configured to provide a first signal and a second signal.

It should be noted that signal generating circuit 143 in embodiments need not generate the sense signal all the time, but only during times when the temperature is actually to be measured via temperature sensor 140. For example, a signal like signal 146 may be generated only during certain phases of signal 145 (for example only when signal 145 is high or only when signal 145 is low), during parts of such phases, only outside edges of signal 145, in regular or irregular intervals and/or according to any other criteria. Therefore, signal generating circuit 143 may generate a signal during times when the IGBT (or other device) is turned off (for example when signal 145 is low), or may refrain from generating a signal at or around edges of signal 145, i.e. during switching of the IGBT (or other device).

In embodiments, as already illustrated with respect to FIG. 2 and as will be illustrated below in further detail, the temperature sensor may be seen as a network of resistances (R) and capacitances (C). In embodiments, an RC constant of the temperature sensor is small enough such that an influence of the temperature sensor on the gate control (for example gate control performed by signal 145) is negligible. For reading the temperature, as mentioned above in embodiments, higher frequency signals (for example in the Megahertz range) are used, and a response to these signals may be influenced by the temperature sensor, such that a reading of the temperature sensor is possible without significantly disturbing gate control.

In some embodiments, first signal generating circuit 144 receives the response to the sense signal generated by second signal generating circuit 143 and may determine a temperature depending on the response, for example based on a phase shift and/or an amplitude of a current in response to the sense signal (for example in response to signal 146). In some embodiments, first signal generating circuit 144 may then adjust the gate control (for example signal 145) depending on the temperature. For example, when an over-temperature is detected, a device like the IGBT used as an example, may be switched off, or alternative gate resistances may be activated depending on temperature.

Figure 15:
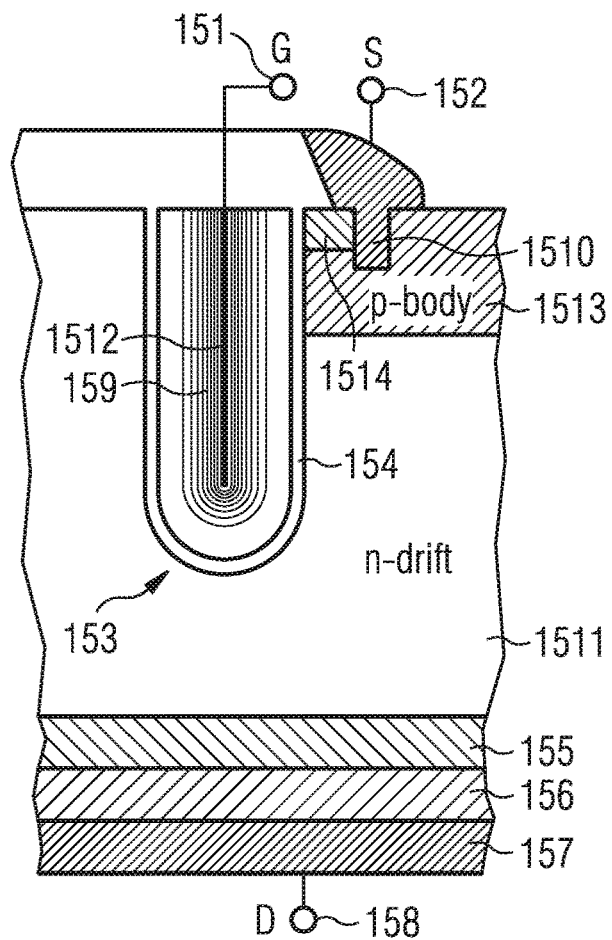
FIG. 15 illustrates a sensor integrated with a device according to another embodiment.

To illustrate this further, FIG. 15 illustrates a cross-sectional view of a part of a field effect transistor (IGBT) serving as an example device integrated with a temperature sensor according to an embodiment. The structure illustrated in FIG. 5 may be an example of implementing a combination of temperature sensor and IGBT usable in the embodiment of FIG. 14, but the structure of FIG. 15 may also be used independently from the embodiment of FIG. 14.

In the embodiment of FIG. 15, a temperature sensor 153 comprising at least an essentially dielectric (electrically insulating) layer portion and a layer portion having a temperature-dependent resistance in a temperature range of interest are provided, for example as explained with reference to FIG. 1, 3, or 12. In the embodiment of FIG. 15, temperature sensor 153 comprises an electrode 1512 coupled to a gate terminal 151 and serving both as gate electrode for the transistor and as an electrode for reading temperature sensor 153. Reference numeral 152 denotes a source terminal coupled to a source contact region 1510 of the transistor. Numeral 1513 denotes a p-body region, and 1514 denotes an n-source region of the IGBT. 1511 denotes an n-drift region of the transistor. 154 is an optional n-field stop layer of the transistor, and 156 is an optional p-emitter region in case the transistor is an IGBT. In case of other types of field effect transistors, p-emitter layer 156 may be omitted. Numeral 157 denotes a drain electrode or other load electrode coupled to a drain terminal 158. While a specific structure of a transistor like an IGBT is shown in FIG. 15, this serves merely as an example, and in other embodiments other conventional structures for implementing transistors or other devices may be used. Numeral 154 denotes a gate dielectric material, for example a gate oxide such as silicon dioxide (SiO$_2$) electrically insulating the gate and the temperature sensor 153 from the remaining structure. It should be noted that gate dielectric 154 may serve as dielectric portion (first layer portion) of the temperature-sensor 153 or as part thereof.

The second layer portion of temperature sensor 153 may be provided with a varying dopant profile, as explained with reference to FIG. 3 (for example curve 39).

Figure 16:
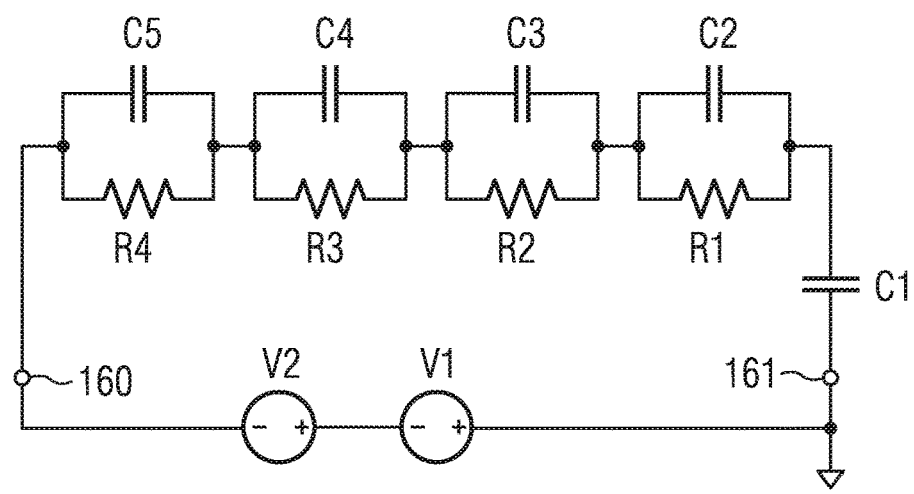
FIG. 16 illustrates an equivalent circuit of a temperature sensor according to an embodiment.

In case of varying dopant profile, the second layer portion may be approximately represented as a series of parallel couplings of resistors and capacitances with variable resistances (depending on the dopant concentration). An example for such an equivalent circuit is illustrated in FIG. 16. In FIG. 16, the first layer portion (which may comprise a gate dielectric) of the temperature sensor is represented by a capacitor C1. A second layer portion which has a temperature-dependent resistance is represented by resistances R1 to R4 and capacitors C2 to C5 which are coupled as illustrated in FIG. 16. Numeral 160 represents a gate terminal (like gate terminal 148 of FIG. 14 or gate terminal 151 of FIG. 15), and numeral 161 represents for example a source terminal (like terminal 149 of FIG. 14 or terminal 152 of FIG. 15). With a dopant profile as illustrated in FIG. 3 in the second layer portion, R4>R3>R2>R1 applies. In other embodiments, other relationships may hold. Resistances R1 to R4 vary with temperature in a temperature range of interest. It should be noted that while in the equivalent circuit of FIG. 16 four resistors R1 to R4 in four capacitors C2 to C5 are used for modelling the second layer portion, in other embodiments different numbers may be used, for example depending on a desired accuracy of the modelling. For modelling purposes, C2=C3=C4=C5 may be used. V1 is a voltage source for applying a gate-source voltage to control a transistor like an IGBT. V1 may correspond to or be included in first signal generating circuit 144. V2 corresponds to a voltage source used for applying a signal having a higher frequency used for temperature measurement, e.g. corresponding to or included in second signal generating circuit 143. As already explained with reference to FIG. 14, the signal generated by V2 may have a higher frequency and/or smaller amplitude than the signal generated by V1. The signal generated by V2 may be essentially a sine signal, and the signal generated by V1 may be a substantially rectangular signal.

Next, with reference to FIGS. 17 and 18 some non-limiting example signals for further illustration will be discussed.

The example signals have been generated using simulations based on the equivalent circuit of FIG. 16. As an example, for simulation purposes C1 to C5 have been set to 1 pF. R4 for the simulation is in the order of 1 kΩ, R3 of the order of 10 kΩ, R2 of the order of 100 kΩ and R1 of the order of 1 MΩ (all varying with temperature). In FIG. 17, a curve 170 illustrates a rectangular gate control signal generated by V1 of FIG. 16. Numeral 171 denotes a signal generated by voltage generator V2 overlaying signal 170. In the example of FIG. 17, signal 171 is generated only when signal 170 is low, for example causing a transistor like an IGBT to be switched off. In other examples, signal 171 may be generated during other periods of signal 170, as already explained with respect to FIG. 14. In the simulation example, signal 170 has a low value of −8 V and a high value of +15 V, while signal 171 has an amplitude of approximately 200 mV. These values serve only as examples, and in other embodiments other values may be used. For example, smaller amplitudes may be used for signal 171, for example about 10 mV.

Figure 18:
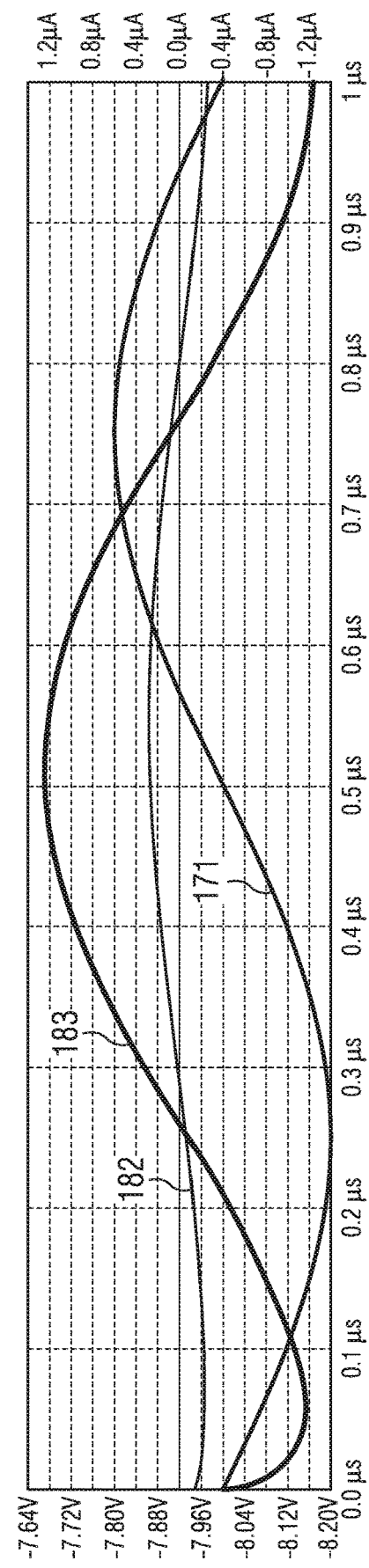

In FIG. 18, a portion of signal 171 is illustrated in magnified form. Curves 182 and 183 illustrate current responses to signal 171 for two different temperatures, the temperature in case of curve 183 being higher than in case of curve 182. As can be seen, curves 182 and 183 differ both as regards their phase shift with respect to curve 171 and as regards their amplitude. Therefore, in embodiments the phase shift and/or the amplitude of a response to a sense signal may be used for determining temperature. In particular, in embodiments a voltage signal may be applied, and a current response of a temperature sensor device may be used to determine a temperature.

Figure 17:
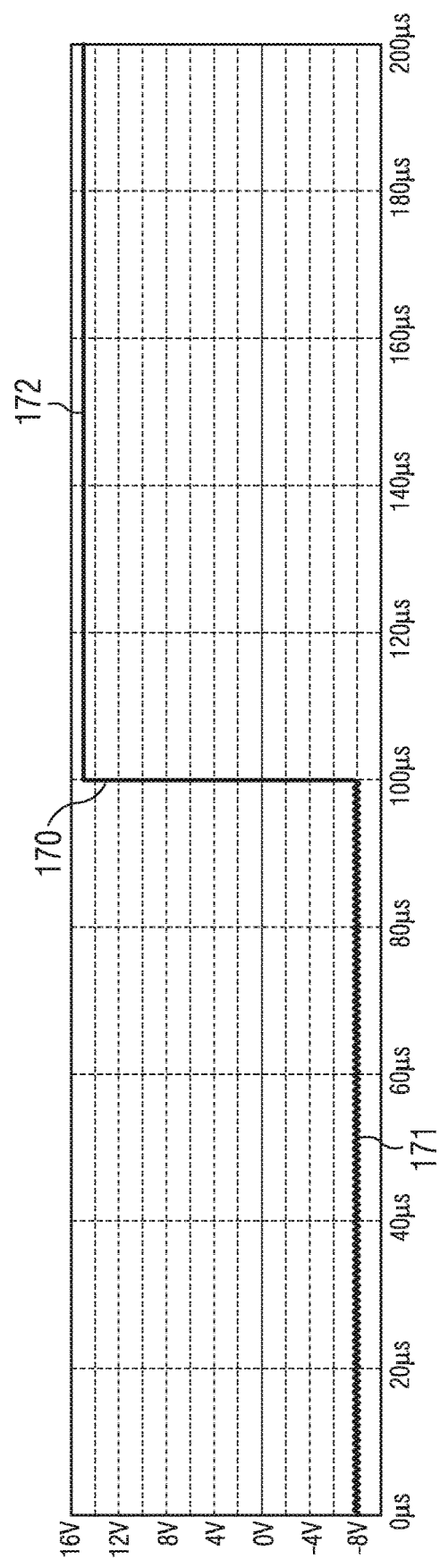
FIGS. 17 and 18 show example signals usable in some embodiments.

The signals shown in FIGS. 17 and 18 serve merely for further illustration purposes and are not to be construed as limiting. In particular, in other embodiments other signal forms, signal frequencies and/or signal amplitudes may apply.

Figure 19:
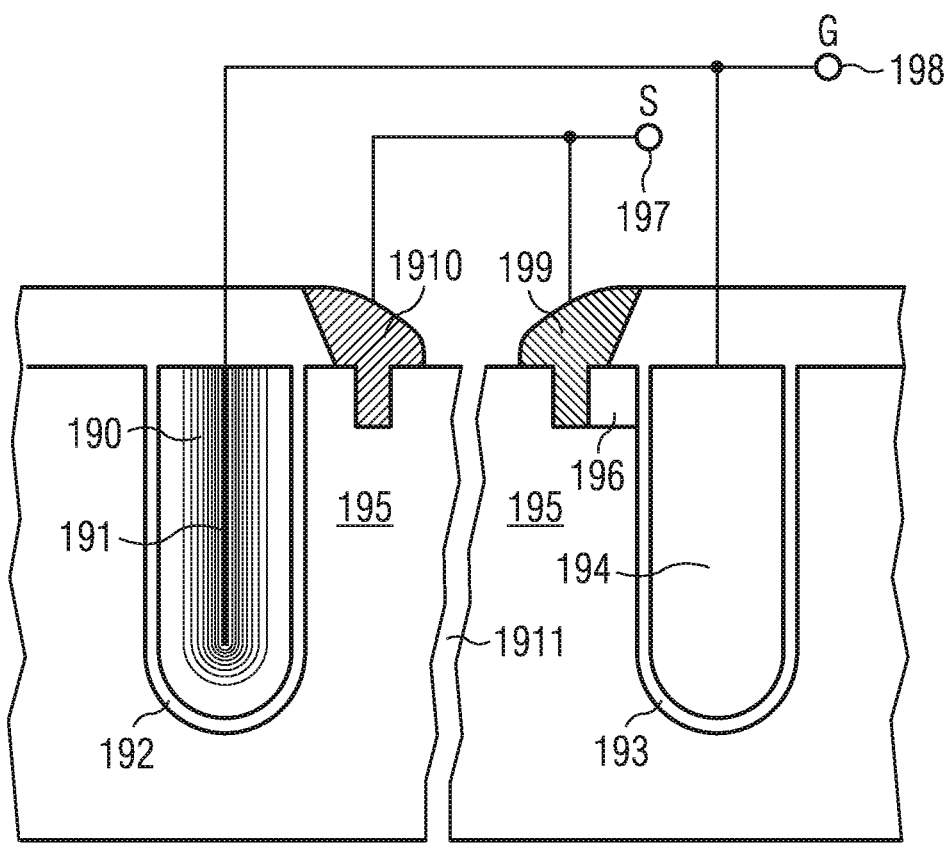
FIG. 19 is a schematic side view illustrating a temperature sensor integrated with a device according to a further embodiment.

In the embodiments discussed with reference to FIGS. 14 to 18, a temperature sensor is used as part of a gate electrode, for example, located in a gate trench. In other embodiments, the temperature sensor may be provided, for example, in a source trench or may be provided in an "inactive" gate trench. A corresponding example is illustrated in FIG. 19. FIG. 19 illustrates a cross-sectional view of a semiconductor structure, similar to the cross-sectional view of FIG. 15. In the representation of FIG. 19, an n-drift region, an n-field stop, an optional p-emitter and a drain electrode illustrated in FIG. 15 have been omitted, but may nevertheless be present in some embodiments.

In FIG. 19, a temperature sensor 190 is provided in a trench. Temperature sensor 190 may comprise an electrode 191 and a dielectric layer 192, which may be formed using a material also used as a gate dielectric 193 in a gate trench. Numeral 194 indicates conductive material, for example polycrystalline silicon or metal, serving as a gate electrode and coupled with a gate terminal 198. Electrode 191 of temperature sensor 190 is also coupled to gate electrode 198. Temperature sensor 190 may be configured as discussed previously, and may in particular use a dielectric layer portion (which may include or be formed by dielectric layer 192) and a second layer portion which has a temperature dependent electrical resistance, as discussed previously.

Furthermore, in FIG. 19 numeral 195 denotes a p-body region, and numeral 196 designates an n-source region. N-source region 196 is coupled with a source terminal 197 via a contact region 199. A further contact region 1910 is provided near temperature sensor 190 and is also coupled with source terminal 197. As marked by lines 1911, the distance between gate 193, 194 and temperature sensor 190 is not limited to any specific distance.

Figure 20:
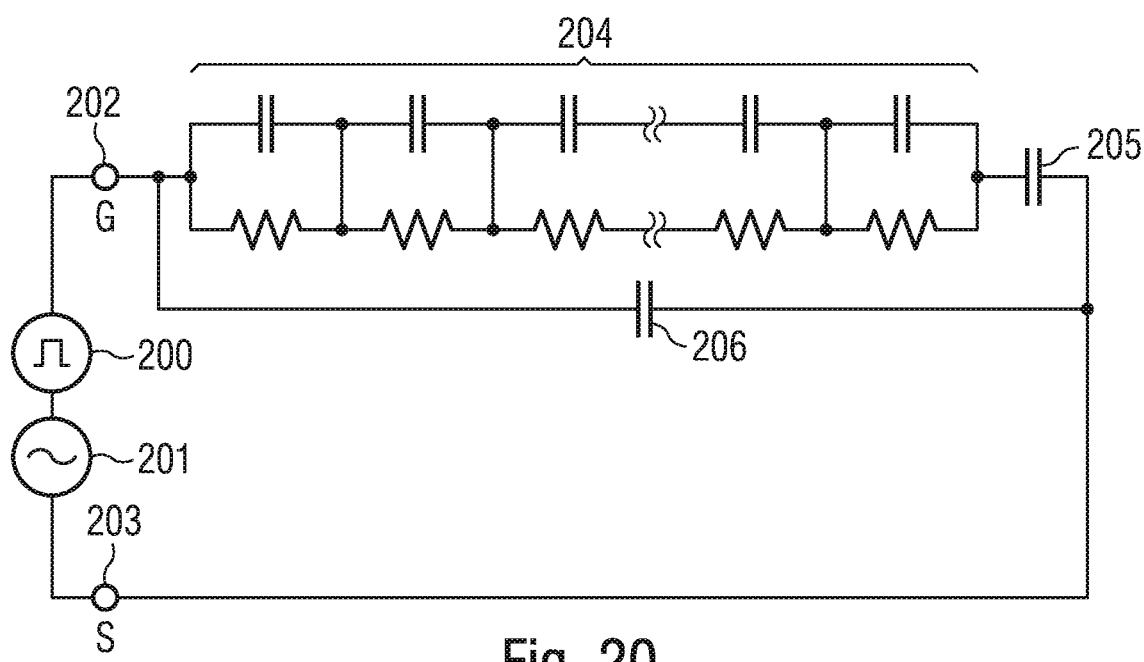
FIG. 20 illustrates an equivalent circuit of a temperature sensor integrated with a device according to a further embodiment.

In the embodiment of FIG. 19, temperature sensor 190 and gate 193, 194 are coupled in parallel. To illustrate this, FIG. 20 shows a schematic equivalent circuit for the device of FIG. 19. In FIG. 20, 202 denotes a gate terminal (corresponding, for example, to gate terminal 198 of FIG. 19), and 203 denotes a source terminal (corresponding, for example, to source terminal 197 of FIG. 19). A capacitor 206 represents a gate capacitance (for example of gate 193, 194 of FIG. 19). A capacitor 205 represents a capacitance of a first (dielectric) layer portion of a temperature sensor (for example including dielectric layer 192 of FIG. 19), and 204 is a series connection of resistors and capacitors representative of a second layer portion which is depending on with temperature. Numeral 204 represents a series connection of a plurality of capacitances and resistors coupled in parallel, similar to the representation of FIG. 16 (resistors R1 to R4 and capacitors C2 to C5). The number of resistors and capacitors used may depend on a desired accuracy of the equivalent circuit.

Numeral 200 in FIG. 20 denotes a first signal generating circuit for generating a gate source voltage to control, for example, a field effect transistor like an IGBT, similar to first signal generating circuit 144 of FIG. 14. Numeral 201 denotes a second signal generating circuit for generating a sense signal to read out the temperature sensor, e.g. similar to second signal generating circuit 143 of FIG. 14. In particular, signal generating circuits 201, 200 may be designed as already explained for signal generating circuits 144, 143 of FIG. 14 or for voltage sources V1, V2 of FIG. 16 and will therefore not be described again in detail.

In other words, reading out the temperature sensor in the embodiment of FIGS. 19 and 20 may be similar to reading out the temperature sensor as explained with respect to FIGS. 14 to 18, although because of the parallel connection of capacitor 206 the exact dependency of the response to the signal generated by signal generating circuit 200 may be different than in case of the embodiments of FIGS. 14 to 18.

Figure 21:
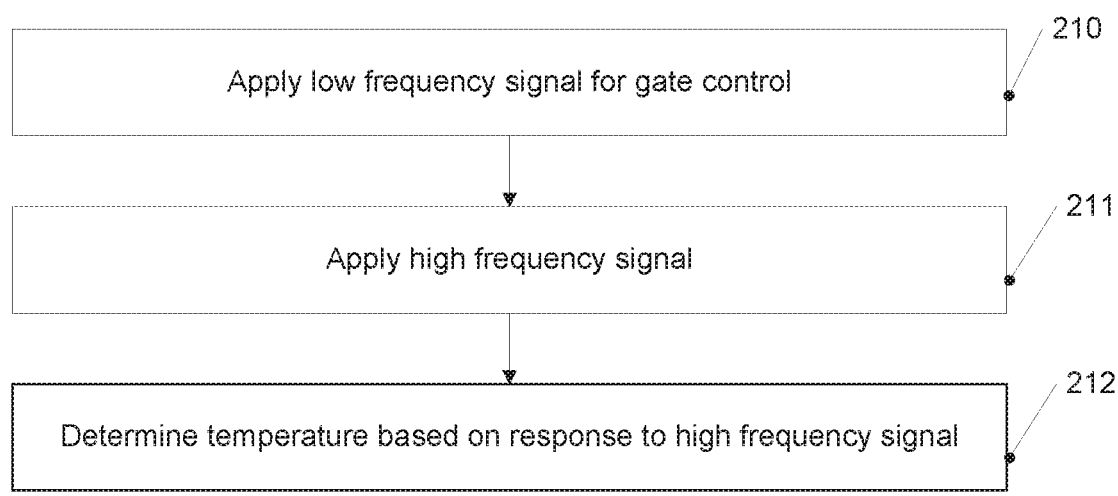
FIG. 21 illustrates a flow chart illustrating a method for reading a temperature sensor according to an embodiment.

FIG. 21 illustrates a control method which may, for example, be used to control and read temperature for the embodiments of FIGS. 14 to 20. While the method of FIG. 21 is illustrated as a series of acts or events, the order in which these acts or events are described is not to be construed as limiting. In particular, the acts and events described in the following with reference to 210-212 may be performed simultaneously. While the method may be applied to the embodiments described with reference to FIGS. 14 to 20, application of the method of FIG. 21 is not limited to these embodiments. Nevertheless, for ease of illustration the embodiment of FIG. 21 will be described referring to the embodiments of FIGS. 14 to 20.

At 210, the method of FIG. 21 comprises applying a low frequency signal for gate control, for example between a source terminal and a gate terminal. For example, the low frequency signal may be a signal generated by signal generating circuit 144 of FIG. 14, by voltage generator V1 of FIG. 16, or by signal generating circuit 201 of FIG. 20. The low frequency signal may be a rectangular signal with varying pulse width, for example, to switch a transistor on and off, as explained previously. In some embodiments, a frequency of the low frequency signal may be in the kHz range.

At 211, the method comprises applying a high frequency signal between the same terminals as the low frequency signal of 210. Applying the high frequency signal may be performed during the whole duration of the low frequency signal or only during parts of the duration of the low frequency signal, while during other parts of the low frequency signal the high frequency signal is blanked out. The terms "high frequency signal" and "low frequency signal" in this respect are to be regarded as relative terms, i.e. a frequency of the low frequency signal is lower than a frequency of the high frequency signal. For example, a frequency of the high frequency signal may be in the MHz range and/or may be at least one order of magnitude, for example at least two orders of magnitude higher than the frequency of the low frequency signal. In addition, in some embodiments an amplitude of the high frequency signal may be lower than an amplitude of the low frequency signal, for example by at least one order of magnitude. In some embodiments, the high frequency signal may, for example, be output by second signal generating circuit 143 of FIG. 14, by voltage generator V2 of FIG. 16, or by second signal generating circuit 200 of FIG. 20. Any modifications or variations discussed for the signal output by signal generating circuits 143, 144, 200, 201 or by voltage generators V1, V2 and/or as discussed with reference to FIGS. 17 and 18 may also be applicable to the low frequency signal of 210 and the high frequency signal of 211.

At 212, the method of FIG. 21 comprises determining a temperature based on a response to the high frequency signal, for example based on a current response. For example, the temperature may be determined based on a phase shift and/or amplitude of the response, as, for example, explained with reference to FIG. 18. It should be noted that determining the temperature does not necessarily imply determining a value of a temperature of any specific temperature scale, but any measure of the temperature in any arbitrary units is intended to fall under the term "determining a temperature".

It should also be noted that the actions with respect to 211 and 212 may also be used to read out a standalone temperature sensor as discussed with reference to FIGS. 1 to 13, i.e. a temperature sensor which has dedicated terminals.

Temperature sensors as discussed above may be used in various applications or aerospace applications. For example, temperature sensors as discussed above may be used for temperature measurement in a combustion chamber or an exhaust tract of an engine, for example a motor in automotive application, or a rocket engine in aerospace applications. Other applications include, for example, all production, for example to sense a temperature of a drill of an oil rig, or solar applications to sense a temperature in a mirror used for collecting solar radiations. However, these applications serve only as illustrative examples, and use of temperature sensors as discussed herein is not limited to any particular application.

The invention claimed is:

1. A device, comprising:
a semiconductor device, and
a temperature sensor device, the temperature sensor device comprising a first layer portion, the first layer portion comprising a dielectric property and thus being electrically non-conductive in a temperature range, and a second layer portion, the second layer portion exhibiting a temperature-dependent electrical resistance in the temperature range and a capacitance, where the first layer portion is above the second layer portion,
wherein the temperature sensor device comprises a capacitive temperature sensor, wherein an overall capacitance of the temperature sensor device comprising the first layer portion and the second layer portion is representative of a temperature sensed by the temperature sensor device,
wherein the semiconductor device and the temperature sensor device share at least one terminal.

2. The device of claim 1, wherein the capacitance of the second layer is temperature-dependent.

3. The device of claim 1, further comprising an electrode electrically coupled with the second layer portion, the electrode being coupled to a terminal of the at least one shared terminal, wherein the electrode is a gate electrode of the semiconductor device.

4. The device of claim 1, further comprising a trench extending vertically down into a semiconductor substrate material in which the semiconductor device and the temperature sensor device are integrated, wherein the temperature sensor device is located in the trench of the semiconductor device.

5. The device of claim 1, wherein the semiconductor device comprises a field effect transistor.

6. The device of claim 5, wherein a gate dielectric of the field effect transistor forms at least part of the first layer portion of the temperature sensor device.

7. The device of claim 5, wherein the temperature sensor device is provided in parallel to a gate structure of the field effect transistor.

8. The device of claim 5, wherein the at least one shared terminal comprises at least one of a gate terminal or a source terminal.

9. The device of claim 8, further comprising a signal generating circuitry configured to apply a gate control signal between the gate terminal and the source terminal, and to apply a further signal between gate terminal and source terminal.

10. The device of claim 9, wherein the further signal has a higher frequency than the gate control signal.

11. The device of claim 9, wherein an amplitude of the further signal is lower than an amplitude of the gate control signal.

12. The device of claim 9, wherein the device is further configured to determine a temperature based on a response of the temperature sensor device to the further signal.

13. The device of claim 12, wherein the signal generating circuitry is configured to modify the gate control signal based on the determined temperature.

14. The device of claim 1, further comprising a temperature-dependent resistor coupled between the temperature device and a terminal of the at least one shared terminal, a sign of a coefficient of the temperature dependence of the resistor being opposite to a sign of a coefficient of the temperature-dependent electrical resistance of the second layer portion.

15. The device of claim 1, wherein the second layer portion comprises a semiconductor material, and wherein a dopant concentration in the semiconductor material increases from a part of the second layer portion adjacent to the first layer portion towards an opposing part of the second layer portion away from the first layer portion.

16. The device of claim 4, wherein the trench comprises sidewalls and a bottom portion, further comprising:
a first liner structure that lines the sidewalls of the trench and the bottom portion of the trench, and defines a first liner gap in the trench,
a second liner structure that lines the first liner gap in the trench,
wherein the first liner structure comprises the first layer portion, and
wherein the second liner structure comprises the second layer portion.

17. The device of claim 16, wherein the second layer portion comprises a semiconductor material comprising a dopant concentration that increases from a part of the second layer portion adjacent to the first layer portion towards an opposing part of the second layer portion away from the first layer portion.

18. The device of claim 16, wherein the first liner structure further comprises a first conductive contact liner disposed between the first layer portion and the sidewalls and the bottom of the trench.

19. The device of claim 18, wherein the second liner structure defines a second liner gap in the trench, and wherein a second conductive contact structure fills the second liner gap.

* * * * *